United States Patent [19]

Mower et al.

[11] Patent Number: 4,713,623

[45] Date of Patent: Dec. 15, 1987

[54] CONTROL SYSTEM FOR MATRIX PRINT HEAD

[75] Inventors: Dan C. Mower, Agoura; Peter H. Wolf, Campbell; Boyd E. Slade, Sunnyvale; David Albertalli, San Jose, all of Calif.

[73] Assignee: Dataproducts Corporation, Woodland Hills, Calif.

[21] Appl. No.: 330,672

[22] Filed: Dec. 14, 1981

Related U.S. Application Data

[60] Continuation of Ser. No. 60,040, Jul. 24, 1979, which is a division of Ser. No. 905,705, Jun. 13, 1977, Pat. No. 4,167,342.

[51] Int. Cl.[4] ........................ H03K 17/00; H03K 5/13; B41J 3/02

[52] U.S. Cl. ........................ 328/72; 400/121; 307/247.1; 307/269

[58] Field of Search ................ 400/124, 121; 307/262, 307/273, 261, 269, 247.1; 328/129, 133, 172

[56] References Cited

U.S. PATENT DOCUMENTS

| | | | |
|---|---|---|---|
| 3,125,691 | 3/1964 | Astheimer | 307/273 |
| 3,728,558 | 4/1973 | Genuit et al. | 307/262 |
| 4,033,444 | 7/1977 | Berry | 400/124 |
| 4,079,824 | 3/1978 | Ku | 197/1 R |
| 4,125,336 | 10/1978 | Chu | 400/124 |

*Primary Examiner*—Stanley D. Miller
*Assistant Examiner*—B. P. Davis
*Attorney, Agent, or Firm*—Spensley Horn Jubas & Lubitz

[57] ABSTRACT

A system for printing dot-matrix characters wherein a double column of dot forming elements is used, and no single dot forming element is required to print more often than once in any four column interval of printed text. Means for timing the actuation of the dot forming elements wherein the "on" time of the individual actuators can be longer than the time interval between columns is included.

2 Claims, 8 Drawing Figures

CONTROL SYSTEM FOR MATRIX PRINT HEAD

This is a continuation, of application Ser. No. 60,040, filed July 24, 1979 which in turn was a division of application Serial No. 905,705 filed June 13, 1977 (now U.S. Pat. No. 4,167,342).

BACKGROUND OF THE INVENTION

1. Field of the Invention

This invention relates to the field of dot-matrix printing and more particularly to systems for dot-matrix printing using a printing head having two columns of dot forming elements.

2. Prior Art

A dot-matrix printer is one which forms characters from a plurality of dots arranged in rows and columns. One format known in the prior art utilizes a 7×7 matrix, that is, a matrix 7 dots high by 7 dots wide.

A conventional way of printing such characters is to force the ends of wires, or styli, into contact with a printing medium such as an inked ribbon, which in turn makes dot marks on paper. The arrangement of the dots within the matrix conveys the form of the characters. The styli are electromagnetically driven and one popular embodiment includes the styli arranged in columnar form, i.e. a column of 7 styli, the columns being printed sequentially. The line is scanned at constant speed and the styli are actuated at the appropriate times to form the desired characters.

SUMMARY OF THE INVENTION

The maximum printing speed of dot matrix printing systems is related to the maximum allowable repetition rate of dots formed along any given horizontal line. If one were to assume, for example, that characters were to be formed in a 7×7 matrix format using a single column of 7 wires travelling horizontally to form the characters, the average character formation speed would be one tenth of the maximum dot formation speed since a character requires six spaces, and the space between characters requires four more for a total of ten. Thus, if dots can be formed at the rate of 1000 per second, such an arrangement can write characters at the rate of 100 per second.

By using two columns of wires to form the characters, it is easy to see how the above quoted speed may be doubled. Through the use of the present invention, however, the average character rate using two columns can be increased by a factor of four over the single column rate, that is, a rate of 400 characters per second, can be achieved even though the wire print rate is still only 1000 per second.

This unexpected increase in capability is achieved by assigning the dot printing sequences within each character to be formed such that with a two column print head, no wire need print more often than once for each four columns. This is done by making stylus printing assignments to individual dots within the characters rather than wire assignments to dot columns as a whole, as is common in the prior art.

The capability of making dot printing assignments on an individual basis allows an additional advantage to be achieved. By properly assigning the printing functions, the wear as between the two styli in the same row can be evened so that maximum head life will be achieved.

An exemplary font of characters is presented herein to illustrate the manner of making the individual dot printing assignments. The assignments along any horizontal row of dots are such that the same print wire is not required to be activated more often than once during any four columns of travel. That is, if a particular dot is required in the first column of a character, and the task of printing that dot is assigned to the left hand column of print wires, that same print wire in the left hand wire column will not be again assigned a printing task until column 5. If it is necessary to print an additional dot in that horizontal row prior to column 5, the task will be assigned to the appropriate wire in the right hand wire column. The font of characters is designed so that it is never necessary to print more than two dots within any four column width.

In order to print dots with electrically actuated styli, current must be applied to the actuators for some finite period of time. Due to the high speed possibilities of the present invention it may be found that the time that the individual actuators must be energized in order to print satisfactory dots is greater than the time between columns. This means that as the character develops column by column, some actuators will have to be energized before others are deenergized. This being the case, a single timer cannot be used to time all of the actuators. It is, of course, possible to have each actuator controlled by a separate timer, but separate timers for each actuator is an undesirable complication and expense. A novel system including two timers, which are used alternately is disclosed which allows the actuators to be energized for longer than the period between columns.

DETAILED DESCRIPTION OF THE INVENTION

One of the aspects of the present invention is an alphanumeric font of dot-matrix characters which has certain characteristics which allow very rapid printing, in conjunction with a double column of dot forming elements. An exemplary font is shown in FIG. 1 with a 7×7 dot format for the character itself, and at least four dot spaces (enough space to print three dot columns) between characters.

One conventional way of forming dot-matrix characters utilizes a printing head having an array of dot forming styli arranged in a column. Each stylus may be independently driven longitudinally into a ribbon and paper by electromagnetic means. The array is moved at constant speed across the paper and the electromagnets selectively energized at appropriate times to form the characters. As a practical matter, styli can be made to operate at a maximum speed of about 1000 dots per second, which leads to a character rate for a 7×7 matrix of 100 per second. By using two columns of styli it is easy to see that the character rate can be doubled, since each column of styli can print rows of dots at a rate of 1000/second and if the columns of dots are printed alternately by the two columns, the slew rate of the print head can be doubled. By utilizing the present invention, however, the print rate can be quadrupled.

While electromagnetically actuated, styli are a common and conventional means of forming dots, and the disclosure herein makes frequent reference to this means, it should be understood that such references are for purposes of illustration and convenience only, and the invention is applicable to all types of dot forming means, including, for example, heated stylus or ink jet dot forming elements.

For ease of explanation in the following disclosure, the horizontal rows of each printed line are designated A, B, C etc. from the top of the character, the bottom row of a seven dot high font being row G. The font disclosed in FIG. 1 is called a 7×7 font, but there may actually be eight rows of dots, a lower row, H, can be provided for underlining of the characters, if desired. The font shown in FIG. 1 includes the optional row H.

Figure 1A:
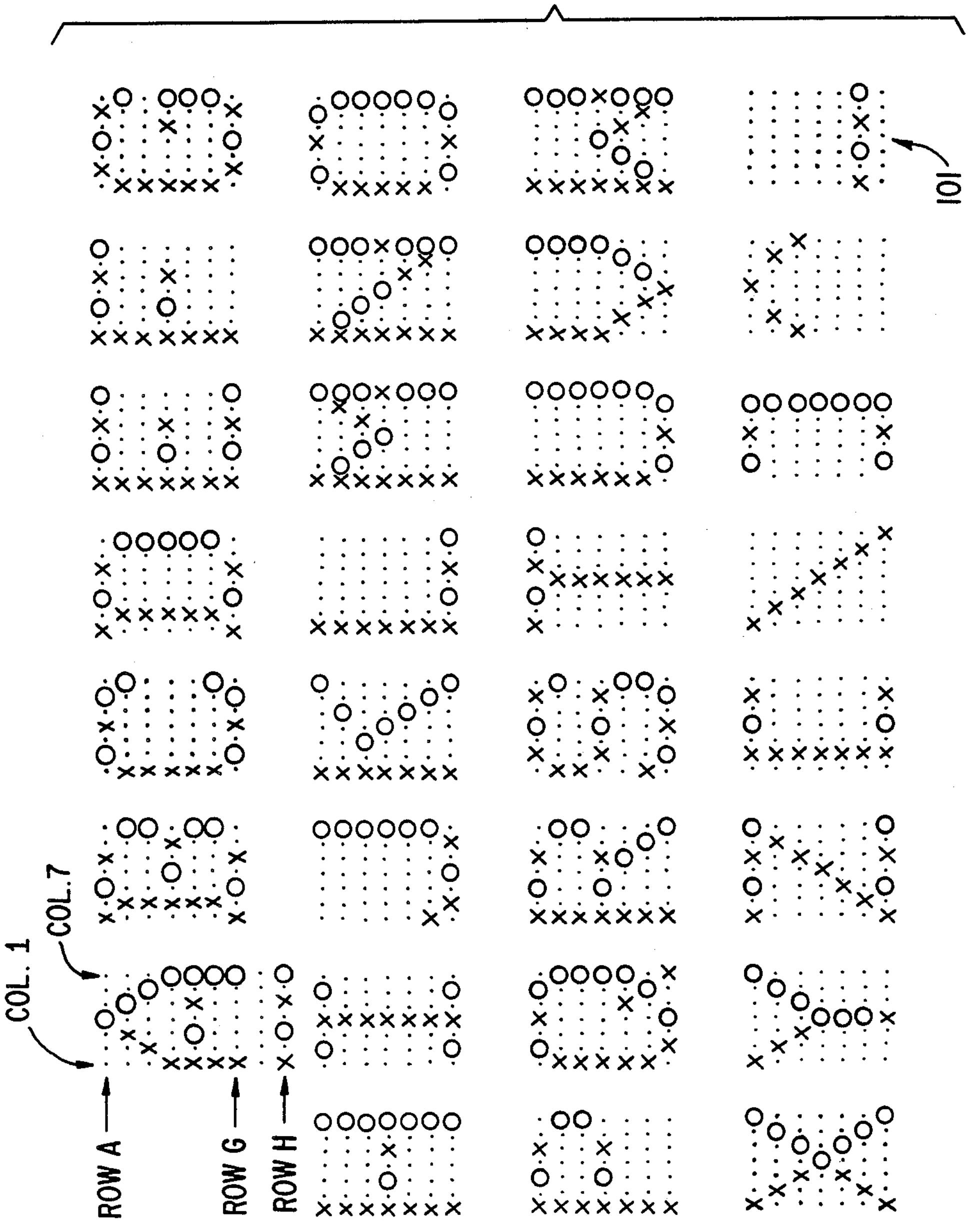
FIG. 1 comprised of FIGS. 1A, 1B and 1C, is an exemplary font of alphanumeric characters in accordance with the present invention.
Figure 1B:
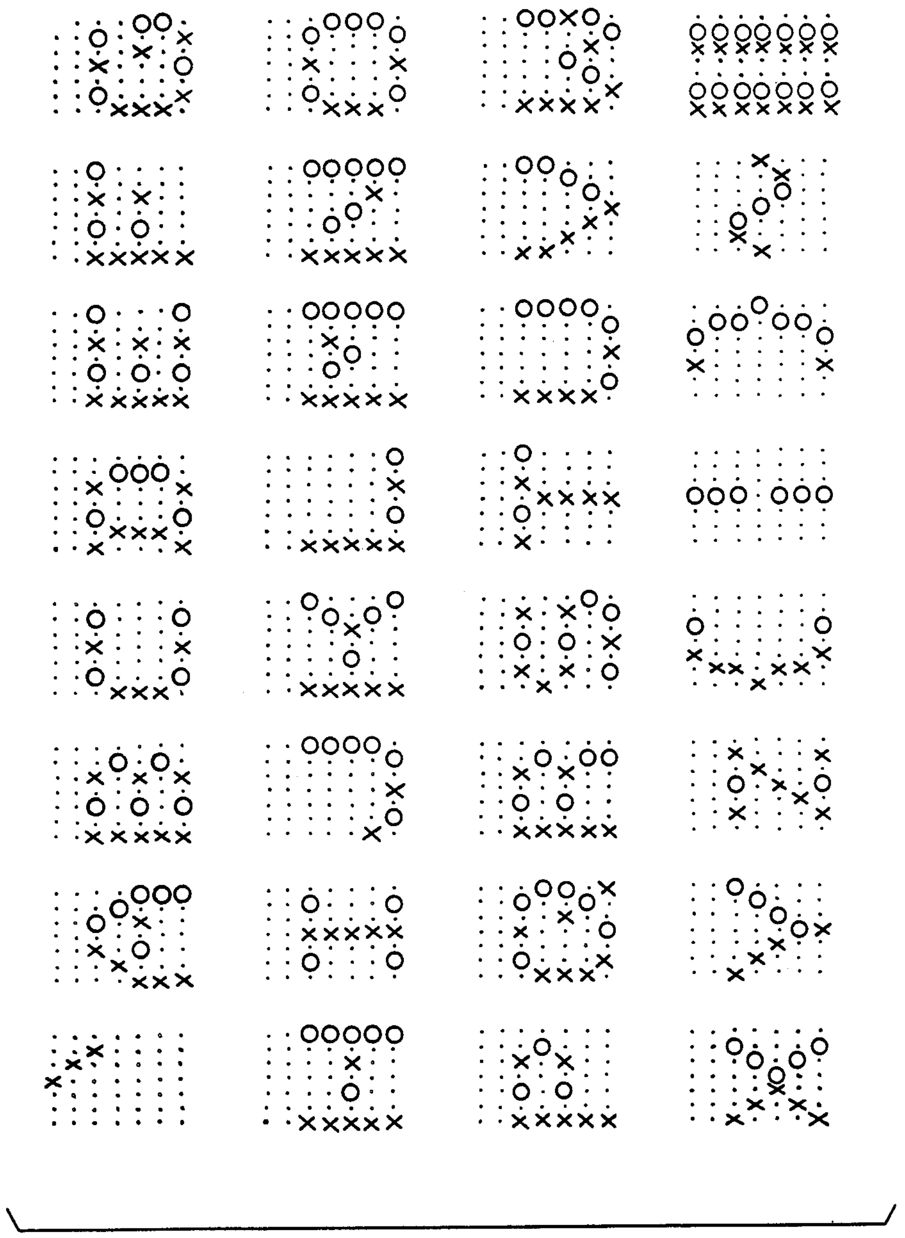
Figure 1C:
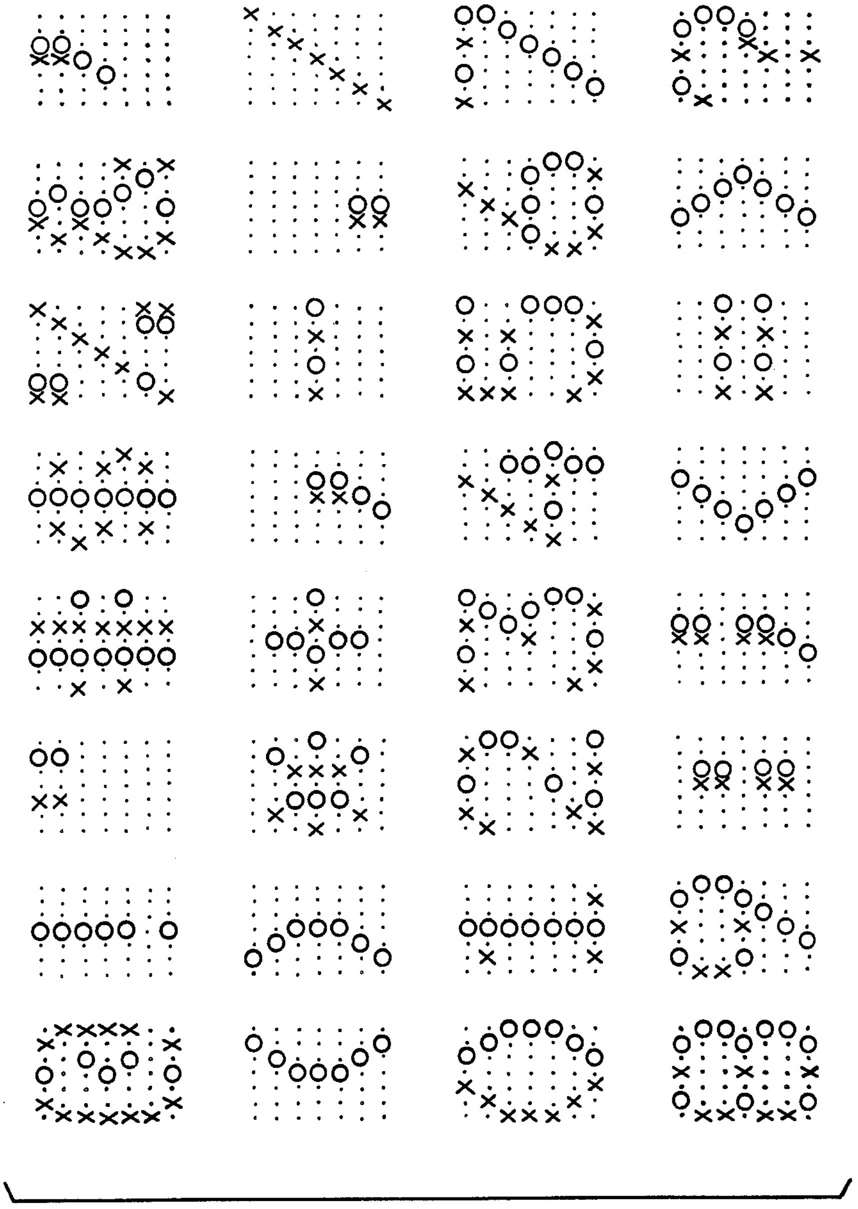

In FIG. 1A, the capital letter "A" is shown underlined, for purposes of example, but it should be understood that the underlining in row H is not a part of the letter "A" but is an independent character that can be printed simultaneously with any other character as desired. An alternative method of underlining which may be achieved using a two column, 14 wire head involves the use of a character having 4 dots in one row, for example, row F, as illustrated by the character designated 101 in FIG. 1A. This character is not printed during the normal scan of a row of text but rather, after a row that requires underlining has been printed, the paper is indexed upward about 0.050 inches (in the case of characters 0.100 inches high and if the underline character 101 is in row F) and on the next horizontal scan, character 101 is activated as needed to underline the appropriate characters previously printed. In this way, the underline character in row F (or in some other row if more convenient) can be made to print in the space of row H.

The columns are designated 1, 2, 3 etc. up to column 10. No dots are printed in columns 8, 9 or 10, however, as these columns comprise the space between the characters.

As referred to above, it is obvious that a print head having two columns of styli can made to print characters twice as fast as a print head with only one column of styli by simply having all of the odd numbered columns printed by the styli in one of the stylus columns and the even numbered columns by the other stylus column. The font depicted in FIG. 1, however, can be printed with a more sophisticated printing assignment system, according to the present invention and as a consequence, the print speed capability of a two columned print head may be made greater by a factor of four over a conventional single column of styli.

In order to present the stylus printing assignment plan in an easy to assimilate manner, the dots which are printed by the styli in one of the printing head columns are shown in FIG. 1 by the symbol "X" and the dots printed by the other stylus column are shown using the symbol "O". The small dots shown in the figure indicate the matrix positions for reference purposes, but are not actually printed.

Figure 3A:
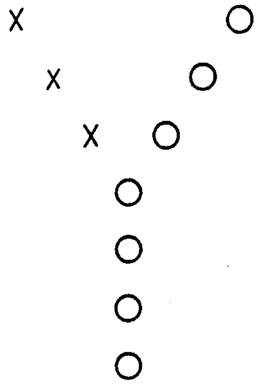
FIG. 3A depicts the letter "Y" in normal type for comparison with the spacing between columns of dot forming elements of the print head of FIG. 3B.
Figure 3B:
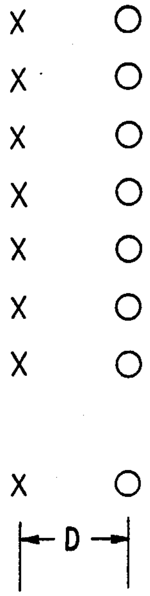
FIG. 3B depicts the spacing between dot forming elements of a print head according to a presently preferred spacing relative to the letters of FIGS. 3A and 3C.

The presently preferred print head stylus arrangement as shown in FIG. 3B depicts the styli in the left hand print head column as the "X" styli and those in the right hand print head column as the "O" styli. It is, of course, understood that all styli actually form dots, and that the "X" and "O" designations in the figures are merely for the purpose of identification. The physical separation of the columns in the print head, indicated by the dimension D of FIG. 3B depends upon the pitch of the characters being formed, and the logic of the printing system. The presently preferred spacing is about 0.030 inches, as will be discussed below.

Figure 3C:
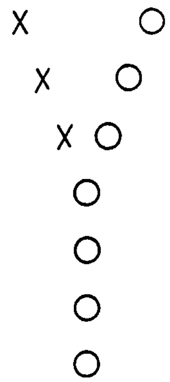
FIG. 3C depicts the letter "Y" in condensed type for comparison with the spacing between columns of dot forming elements of the print head of FIG. 3B.

FIGS. 3A and 3C show the letter "Y" in normal and condensed type respectively as compared to the head column spacing showin in FIG. 3B. As can be noted, the X column styli trail the O column styli by three columns in the case of normal type and five columns in the case of condensed type. These relationships will be further discussed below.

An inspection of FIG. 1 will reveal that in any row, no two Xs or Os appear closer together than four column spaces. If an X appears in a row of Column 1, no other X will appear in that row until Column 5. Several adjacent columns may include Xs, but not in the same row. For example, Column 1 of the capital letter "A" has Xs in rows D, E, F and G, while in Column 2, "X" appears only in row C. It can be noted that column 3 includes both an X and an O, the O being in the row E. The O in row E, is necessary because an X appeared at row E column 1 and four column spaces have not elapsed before column 3.

A font of characters having the characteristics described in the previous paragraph can be printed at the rate of 400 characters per second using a double column of styli operable at 1000 dots per second, since no stylus need operate more than once in any adjacent four columns.

It was previously noted that the letter "A", for example, contains Xs in each of columns 1, 2, 3 and 4 and that column 3 contains both an X and an O. From this (as well as other letters) it can be variable from letter to letter but that the dots within the individual columns must be assignable as required to conform to the established font characteristics.

By judiciously assigning the printing tasks, an additional advantage may be obtained using the printing system of this invention. That advantage is that wear, as between the styli in the X and O columns can be equalized. It is obvious from an inspection of a dot-matrix font of alphanumeric characters that the major wear due to printing upper case letters and numerals would occur to styli in rows A and G, and in the case of lower case letters in rows C and G. Thus, if in the course of printing, if the X and O column styli in these heavily used rows can be assigned such that the number of strikes made by each is equal, the life of the head will be maximized. Such equalization is preferably made with respect to upper case, lower case, and numerals separately so that all mixes of language and numerals will result in even wear in the equalized rows.

The method of equalization (which can be carried out for all rows, if desired) is illustrated in the case of numerals by considering the printing of row A. The numerals having an even number of dots in the wor, i.e. 0, 3, 5 and 7, are automatically equalized and need not be considered. The numerals 1, 2, 4, 6, 8 and 9, however, have an odd number of dots in row A. Since the usage of numerals is probably uniform, equalization is accomplished by assigning one more X dot than O in row A of three of the numerals and one more O dot than X in the other 3. Thus, the numerals 1, 8 and 9 are shown in FIG. 1 with one excess X strike in row A. Numerals 2, 4 and 6 have one excess O strike.

The situation is a bit more complicated in the case of letters. Consider row G of the upper case font. Letters B, D, F, J. O, P, S, T, V, C, G, I, Q, U and Y have an odd number of dots in row G. Letter equalization depends to some extent on the predominant language to be printed by the head since the frequency of letter usage is different in different languages. Since in each letter as identified above, there will be either one more X strike than O or vice versa, equalization can be achieved by dividing the letters into two groups, one group having an extra X and the other an extra O. The sum of the frequencies of occurrence of the letters in each group are made equal. Thus, if one group is made to contain B, F, P, T, V, G, Q, Y, D, and J, and the other group C, I, U, S, and O, row G will be found to be equalized with respect to the English language. The frequencies of occurrence of these letters in the English language are usually considered to be about: B, 1.4%; F, 2.9%; P, 2.0%; T, 10.5%; V, 0.9%; G, 2.0%; Q, 0.1% Y, 2.08%; D, 3.8%; and J, 0.1% for a total of 25.7 for the first group and C, 2.8%; I, 6.3%; U, 2.5%; S, 6.1% and O, 8.0% for a total of 25.7 also.

In the font of FIG. 1, only rows A and G have been equalized for wear since these rows are the most heavily used however it may be desired to equalize all rows in some cases, and in such a case it can be done using the principles discussed above.

Different languages, and perhaps even different jargon within the same language could alter the optimum dot assignment system to some extent and to the extent that the print head is used to print such different text, the equalization may not be optimum. It is practical, of course, to provide logic circuitry programmed to equalize stylus wear for any desired language or jargon in accordance with the principle just discussed. The appropriate logic can be activated whenever that particular language or jargon is being printed.

An additional feature made possible by the system of the present invention is that each row of dots may be printed in the least possible time to allow the maximum possible time for changing character data, etc. This result may be obtained in the system of the present invention by making all of the dots in either column 1 or column 7 of the same type, X or O. If for example, as shown in the font of FIG. 1, all of the dots in column 1 are made of the X variety, the printing of the character will not begin until the O stylus (which is the leading stylus when printing left to right) reaches column 2. When printing right to left, the character is completely printed when the O stylus (which is then the trailing stylus) finishes printing in column 2.

If a dual column print head were to be used to print a 7×7 dot-matrix font as described herein at the rate of 400 characters per second, the dot columns would be printed at about 250 micro-second intervals even though no individual stylus is actuated more often than once per millisecond. In practical print heads the current pulse to the actuator must often be longer than 250 microseconds, so that in those cases it is not possible to use a single timer to time the firing of all of the actuators. It is ofcourse possible to use 14 timers (for a two column, seven row matrix) to do the job, but this is wasteful and expensive. A circuit as shown in FIG. 2 allows two timers to be used alternately to time the pulses to the styli actuators so that actuator pulses longer than the time between columns can be accomodated.

Figure 2A:
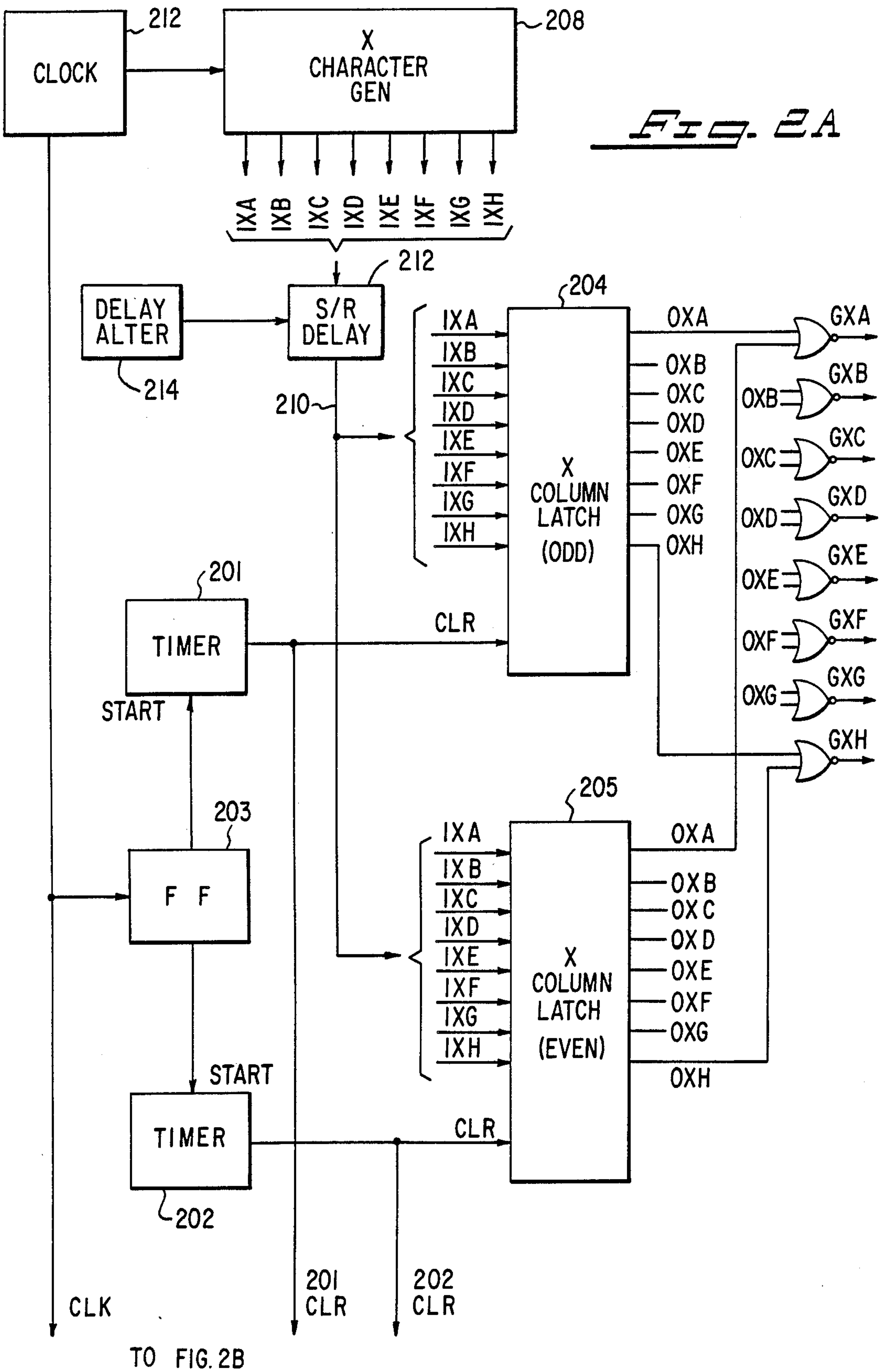
FIG. 2, comprised of FIGS. 2A and 2B, is a schematic diagram of a timing and control system for stylus actuation in accordance with the present invention.
Figure 2B:
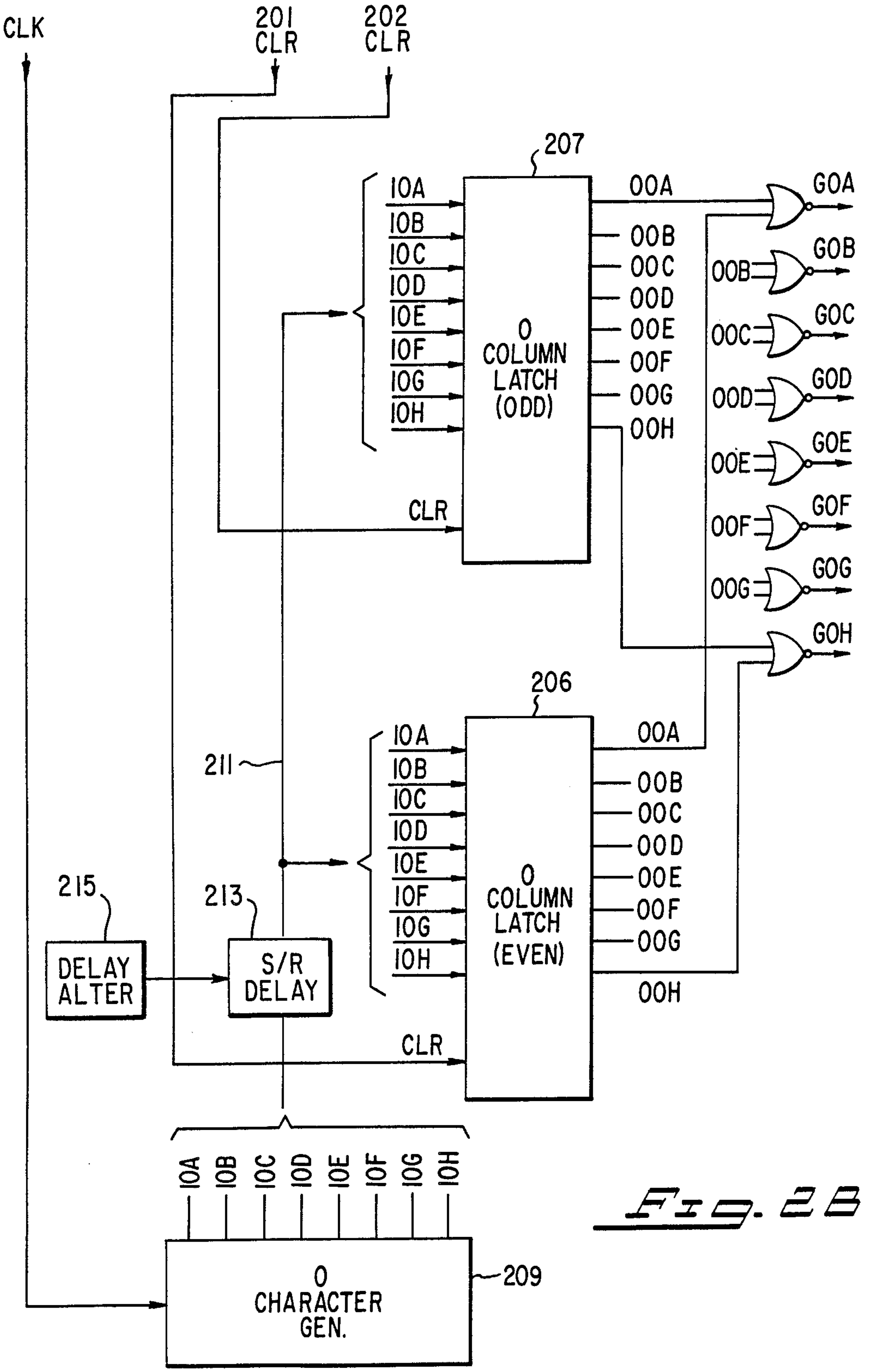

The two one shot timers 201 and 202 shown in FIG. 2 are alternately selected by flip flop 203, which is in turn driven by a clock pulse signal generated by clock 212. The pulses generated by timers 201 and 202 have a duration as required to properly operate the electromagnetic actuators which drive the printing styli. The output of timer 201 is fed to the "clear" input of latches 204 and 206. Latch 204, as will be discussed in detail below, controls styli in the "X" print head column for printing in odd numbered columns while latch 206 controls styli of the "O" print head column for printing in even numbered columns. Similarly timer 202 provides a "clear" signal for latches 205 and 207 which control the "X" and "0" head columns for printing even and odd numbered columns respectively.

Each of the latches 204 through 207 receives input data from an associated character generator. Latches 204 and 205 receive their input data from the "X" column character generator 208 while latches 206 and 207 receive theirs from the "O" column generator 209. The character genertors 208 and 209 each contain appropriate read only memories (ROMs) in which are stored the bits of information as to the makeup of the font of characters to be printed, for example the font of FIG. 1. The means for storing such information and retrieving same serially as required, column by column, is well known in the art and need not be discussed here in detail. It is sufficient to state that the character generators provide column by column information to the latches over lines 210 in the case of the X character generator and 211 for the O character generator.

Due to the physical separation between the X and O column styli, the printing information corresponding to a particular column to be printed is not fed to both columns of styli simultaneously but the information to the trailing print head column must be delayed with respect to the leading column so that dots for that column will be printed in the proper location. The appropriate delays can be accomplished by using shift registers as required in lines 210 and 211. The art of delaying one set of data with respect to another is well known and is not described in detail. The amount of delay depends upon the slew speed of the head, the amount of physical separation of the head columns, and the pitch of the character being printed. One aspect of the present invention is the simplicity with which changes in character pitch can be made. For example, a presently preferred print head column separation is 0.030 inches. To make 10 pitch characters, the data to the trailing column is delayed by three clock pulses and the slew rate of the head is set to 0.030 inches/3 clock pulses. To print condensed characters, the trailing column delay is increased to five clock pulses and the slew rate of the head adjusted to 0.030 inches/5 clock pulses. This provides characters having a pitch of 16.66/inch.

Other than shift register delay means can be utilized to cause the character generators to output data with the desired synchronization. The character data is stored within the character generators in ROM's which have certain predetermined addresses, and the data is retrieved by interrogating the memory at that address, for example, corresponding to Column 1 of the character to be printed, followed by Column 2, etc. By altering the address codes as fed to one of the character generators with respect to the other, the ROM's having data corresponding to X column 1, for example, can be retrieved at the same time as data corresponding to O column 4. At the end of a liner of printing, when it is desired to print in the reverse direction, it is a simple matter to alter the address altering means so that, for example, data corresponding to X column 4 appears at the same time as data corresponding to O column 1. The address alteration can also easily be varied to account for condensed pitch type. The means for altering addresses in this fashion is well known in the art.

Each of the groups of lines 210 and 211 include a line corresponding to each row of the character. Thus, latch 204, for example, has inputs denominated IOA, IOB, etc through IOH from character generator 208. The other latches have similar inputs. For every latch input IOA, IOB, etc. or IXA, IXB, etc. there is a corresponding latch output OOA, OOB, etc., or OXA, OXB, etc.

The latch outputs are fed to NOR gates which in turn control the firing of the stylus actuators. The OXA outputs of latches 204 and 205 are coupled to NOR gate GXA, the OXB outputs to NOR gate GXB, etc. Similarly the OOA outputs of latches 206 and 207 are coupled to NOR gate GOA etc.

For purposes of clarity, the input connections to NOR gates GOA, GOH, GXA and GXH only are shown to FIG. 2, but it will be understood that similar input connections are made to all of the NOR gates. The gates GXA, GXB, etc. control the actuation of the styli in the X head column rows A, B, etc. and gates GOA, GOB, etc. control the actuation of the O head column rows A, B, etc. If a signal appears at either input of one of the NOR gates, its associated stylus will be actuated. The means for accomplishing such control is well known in the art and will not be further discussed.

The timers 201 and 202 normally couple a "clear" signal to the CLR input of each of the latches 204 through 207. A clear signal at the CLR input of these latches erases any data which may be in the latches and keeps the latch outputs at zero. Upon receipt of a "start" signal from flip flop 203, the timer receiving said signal (alternately 201 and 202) removes the clear input from its associated latches allowing the data input from the character generators then existing to be latched in, and transferred to the corresponding latch outputs. After a predetermined interval, the timer reverts to its quiescent state again applying a clear signal to its latches. The predetermined interval is the desired actuation time of the printing styli. As soon as the input data is latched into one of the latches by removal of the clear signal, data at the input to that latch may be changed without affecting the latch otuput. Thus after data is latched the character generators are free to output data corresponding to the next column for use by the latches associated with the idle timer. The second timer may be activated prior to the conclusion of the timing interval of the first timer.

To illustrate the operation of the circuit, assume that the letter "S" of the font of FIG. 1 is being formed, and assume further that the mechanical separation of the X column and O column styli is equal to three column spaces, that is, if the X column styli are printed Column 1 at a particular instant, the O column styli will be printing in column 4. As will be discussed later, this is a presently preferred stylus column separtion for standard width characters. Assume that the printing is being done left to right and that the O stylus column is the right hand column. As the O stylus column of the printing head approaches the space allotted to the character S to be printed, the character generators will generate no data since there are no "O" dots in either columns 1, 2 or 3 of the letter S and the X column styli are physically trailing the O column by three columns. At some point in time, however, the "O" character generator (in response to a clock pulse) will generate print data for column 4, that is, signals on lines IOA, IOD, and IOG of lines 211. At the same time, the X character generator is outputting signals corresponding to column 1, signals on lines IXB, IXC, and IXF of lines 210. These signals are applied to the associated latch inputs.

The clock pulse is also applied to flip flop 203 causing a start signal to be coupled to timer 201. This removes the clear signal from latches 204 and 206 and starts the timing period of the timer.

Removal of the clear signal from latches 204 and 206 causes their input data to be latched and transferred to the latch output terminals. Thus outputs appear at OOA, OOD, and OOG of latch 206 and OXB, OXC, and OXF of latch 204. NOR gates GOA, GOD, and GOG are thereby energized as are gates GXB, GXC, and GXF. The NOR gates energized cause power to be applied to the stylus actuators of column X rows B, C, and F and column O, rows A, D, and G.

At some later time, and perhaps before the printing cycle of X column 1 and O column 4 is complete, the next clock pulse causes the character generators to output data corresponding to O column 5 and X column 2. Reference to FIG. 1 shows that there are no O dots in column 5 but that column 2 requires printing of dots in rows A, D, and G. Thus, while the O generator has no printing outputs at this time, printing signals appear at lines IXA, IXD and IXG of lines 210.

The clock pulse also causes flip flop 203 to start timer 202, removing the clear signal from latches 205 and 207. Outputs OXA, OXD, and OXG thereby appear on latch 205. This results in the actuation of the styli of column X rows A, D, and G.

When the timing period of timer 201 is over, timer 201 reasserts a clear signal to latches 204 and 206 and current is cut off from the styli actuators of column X rows B, C. and F, and column O rows A, D, and G. This has no effect on the actuation of column X rows A, D, and G styli since these are being controlled by latch 205.

The next clock pulse to be applied to the character generators 208 and 209 and flip flop 203 restarts timer 201 and cause the character generators to output data for the next columns, namely X column 3 and O column 6. As before, latches 204 and 206 cause the appropriate gates to energize the styli for printing the required dots in these columns.

The process as described above is repeated until all columns in the line being developed are printed. The printing medium is then indexed up one line, and the columnar printing process is repeated for the next line of characters, except that printing is done right to left. In printing right to left, the X column will physically lead the O column rather than vice versa, so that the appropriate logic delays to properly synchronize the character generators must be provided. Such considerations are well known in the prior art and means for accomplishing same are at the disposal of competent designers. Consequently, no detailed discussion thereof is presented here.

A typical character printed in accordance with the font disclosed in FIG. 1 has a height of 0.105 inches and a pitch of 10 characters per inch for normal print. The styli for such characters are preferably about 0.015 inches in diameter and the X and O stylus columns are spaced three columns or 0.30 inches apart.

It is possible to form characters of the type herein disclosed with any physically practical spacing between the X and O columns of the printing head, provided that the character generators are driven in the proper time sequence to cause registration of the printed columns. However, if the printing head columns are spaced about 0.030 inches apart, characters having a pitch of 10 per inch can be developed by using a clock pulse repetition rate of one per printed column and delaying the character data from one of the character generators with respect to the other by 3 clock pulses. A condensed character having a pitch of 16.66/inch can be developed using the same data by merely increasing the delay between the X and O character generators to 5 clock pulses from 3, and slowing the slew rate of the print head accordingly. By this means, two desirable printing pitches can be accommodated using a single printing head, and the logic delays required are easily obtainable integral values.

In other words, when forming normal print, the X styli are forming column 1 at the same time that the O styli are forming column 4, a distance of three column spaces away. If the actual spacing of the X and O styli is 0.030 inches, a full character and space of 10 column spaces would equal 0.100 inches, corresponding to a pitch of 10 characters per inch. If the same printing head were used such that when the X styli were printing column 1, the O styli were printing column 6, five column spaces away, the total character width would be 0.060 inches which corresponds to a pitch of 16.66 characters per inch. In either case, of course, the linear speed of the printing head must be adjusted so that the X column styli arrive at the location of the previously printd O column at very nearly the exact number of clock pulses after the corresponding O column is printed, as is required by the logic in use at the time. If the slew rate of the printing head is not exactly that theoretically required, the characters printed may be deformed due to the dot columns not being straight. If the error is great enough, the characters may even become undecipherable.

I claim:

1. A timing system for controlling dot-matrix printing heads which comprises:

(a) a clock providing a series of pulses;

(b) a pair of timers each providing an output pulse having a predetermined time duration in response to an input pulse;

(c) a flip flop providing input pulses alternately to said timers in response to clock pulses;

(d) a pair of latches each having a plurality of inputs, and a plurality of outputs corresponding to said inputs, the inputs of one of said latches being paralleled with the inputs of the other of said latches;

(e) coupling means for coupling each of said timers to one of said latches whereby signals appearing at the inputs of said latches at the start of an output pulse coupled to said latch will be coupled to the output of said latch for the duration of the output pulse coupled to said latch;

(f) a plurality of gating means coupled to the outputs of said latches, each of said gating means having an input coupled to an output of the first of said latches and another input coupled to the corresponding output of the other of said latches, whereby a signal from either of said latches will actuate said gate; and (g) means for coupling the output of each of said gating means to a dot forming element of a dot-matrix printing head.

2. A timing system for controlling dot-matrix printing heads which comprises:

(a) a pair of timers, each providing a signal of predetermining time duration;

(b) means for activating said timers alternately;

(c) a pair of latches, each of said latches having a plurality of inputs and a plurality of outputs corresponding to said inputs;

(d) coupling means coupling one of said timers to each of said latches whereby data at said inputs of said latches at the start of said predetermined time duration will be coupled to said outputs of said latches for the duration of said predetermined time duration;

(e) a plurality of gating means coupled to said pair of latches, each of said gating means being coupled to an output of each of said latches; and (f) means for coupling the output of each of said gating means to a dot forming element of a dot-matrix printing head.

* * * * *